(12) United States Patent  
Ishibashi

(10) Patent No.: US 11,660,643 B2  
(45) Date of Patent: May 30, 2023

(54) SUBSTRATE CLEANING DEVICE AND SUBSTRATE CLEANING METHOD

(71) Applicant: EBARA CORPORATION, Tokyo (JP)

(72) Inventor: Tomoatsu Ishibashi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 139 days.

(21) Appl. No.: 16/971,857

(22) PCT Filed: Feb. 15, 2019

(86) PCT No.: PCT/JP2019/005477  
§ 371 (c)(1),  
(2) Date: Dec. 18, 2020

(87) PCT Pub. No.: WO2019/163651  
PCT Pub. Date: Aug. 29, 2019

(65) Prior Publication Data  
US 2021/0129194 A1 May 6, 2021

(30) Foreign Application Priority Data  
Feb. 23, 2018 (JP) .............................. JP2018-030564

(51) Int. Cl.  
*B08B 3/02* (2006.01)  
*H01L 21/02* (2006.01)  
*H01L 21/67* (2006.01)  
*H01L 21/687* (2006.01)

(52) U.S. Cl.  
CPC .......... *B08B 3/02* (2013.01); *H01L 21/02057* (2013.01); *H01L 21/02087* (2013.01); *H01L 21/67051* (2013.01); *H01L 21/68764* (2013.01); *B08B 2203/0288* (2013.01)

(58) Field of Classification Search  
CPC ....................................................... B08B 3/02  
See application file for complete search history.

(56) References Cited

U.S. PATENT DOCUMENTS

| 6,516,815 B1 | 2/2003 | Stevens et al. |
| 2005/0087219 A1 | 4/2005 | Takahashi et al. |
| 2008/0212049 A1* | 9/2008 | Fukutomi ......... H01L 21/67225 355/53 |
| 2015/0283588 A1 | 10/2015 | Soejima et al. |

(Continued)

FOREIGN PATENT DOCUMENTS

| JP | H06-005575 A | 1/1994 |
| JP | H10-144648 A | 5/1998 |
| JP | 2000-216126 A | 8/2000 |

(Continued)

OTHER PUBLICATIONS

International Patent Application No. PCT/JP2019/005477; Int'l Search Report; dated Mar. 19, 2019; 2 pages.

*Primary Examiner* — Jason Y Ko  
(74) *Attorney, Agent, or Firm* — BakerHostetler

(57) ABSTRACT

Providing a substrate cleaning device and a substrate cleaning method having high detergency. Provided is a substrate cleaning device including: a substrate rotating mechanism that rotates a substrate; and a first nozzle and a second nozzle that eject an ultrasonic cleaning solution toward a predetermined surface of the substrate that is rotated, wherein the first nozzle and the second nozzle are held in one casing.

8 Claims, 15 Drawing Sheets

(56) References Cited

U.S. PATENT DOCUMENTS

2017/0271145 A1  9/2017  Dietze et al.
2019/0088510 A1  3/2019  Ishibashi

FOREIGN PATENT DOCUMENTS

| JP | 2001-135612 A | 5/2001 |
| JP | 2002-124504 A | 4/2002 |
| JP | 2006-310456 A | 11/2006 |
| JP | 2007-311756 A | 11/2007 |
| JP | 2008-036557 A | 2/2008 |
| JP | 2015-013250 A | 1/2015 |
| JP | 2016-012645 A | 1/2016 |
| JP | 2017-162889 A | 9/2017 |
| WO | WO 2017/154673 A1 | 9/2017 |

\* cited by examiner

[Fig. 1]
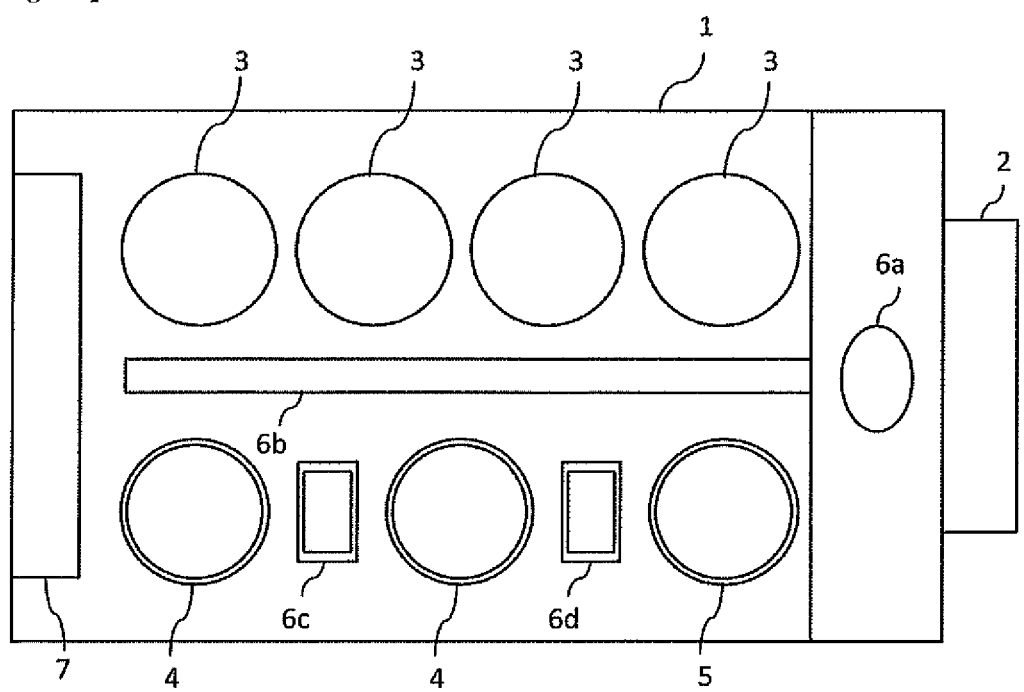

[Fig. 2]
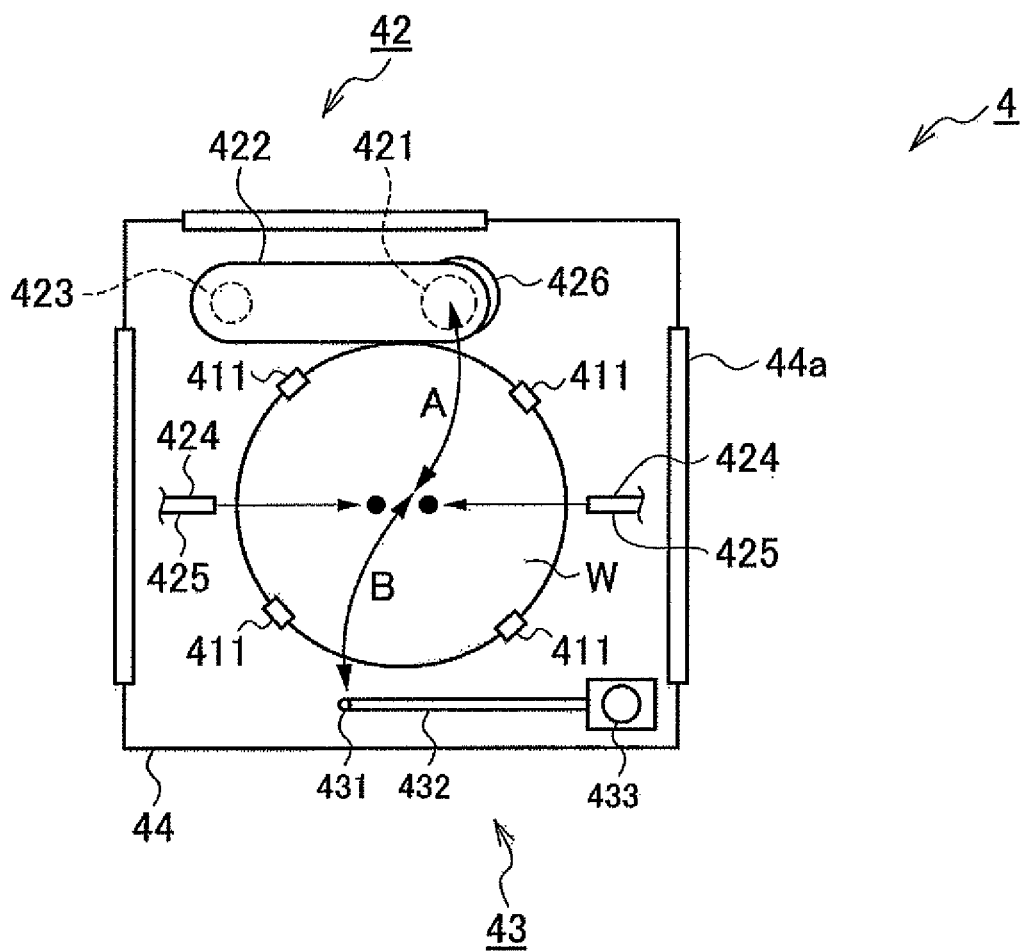

[Fig. 3]
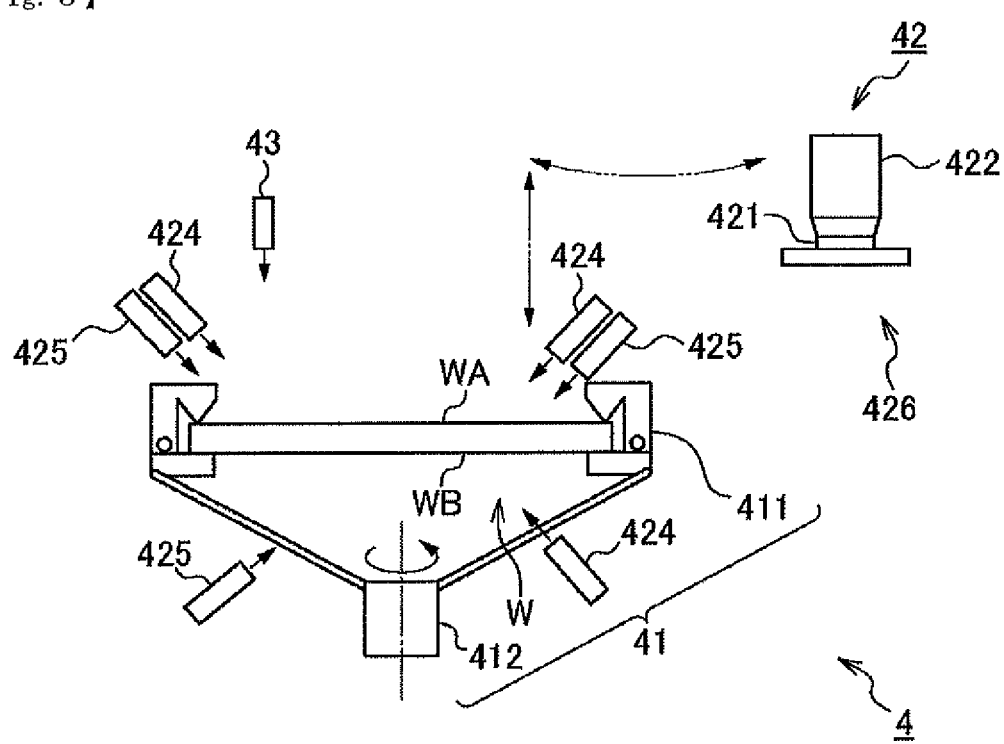

[Fig. 4]
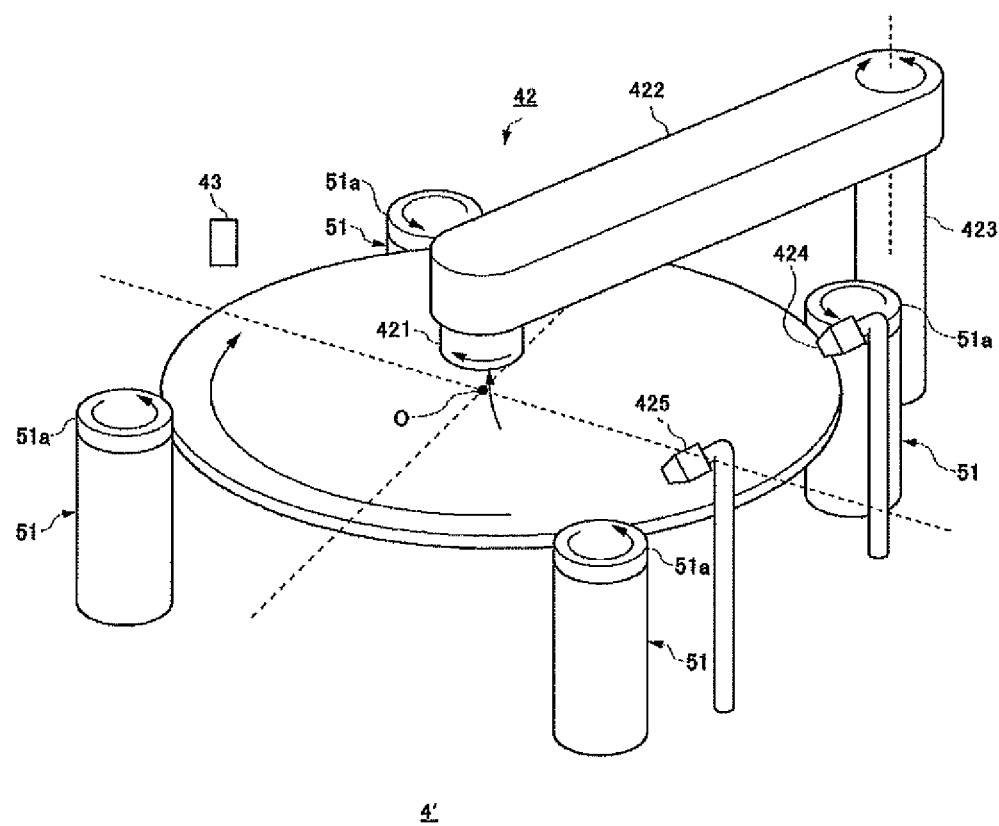

[Fig. 5A]
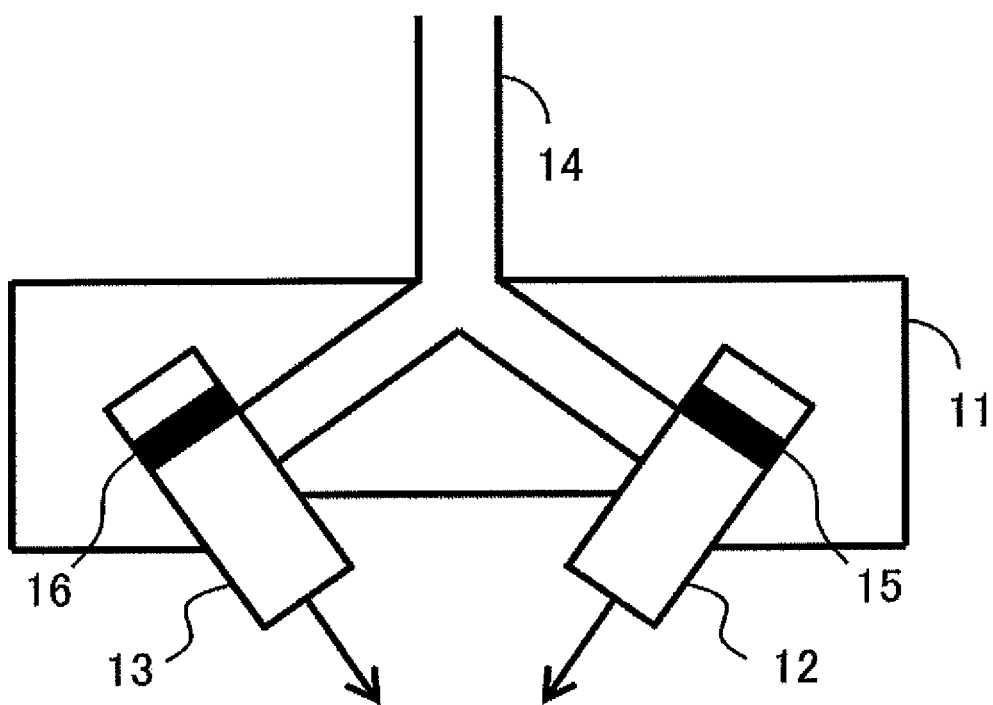
431

[Fig. 5 B]
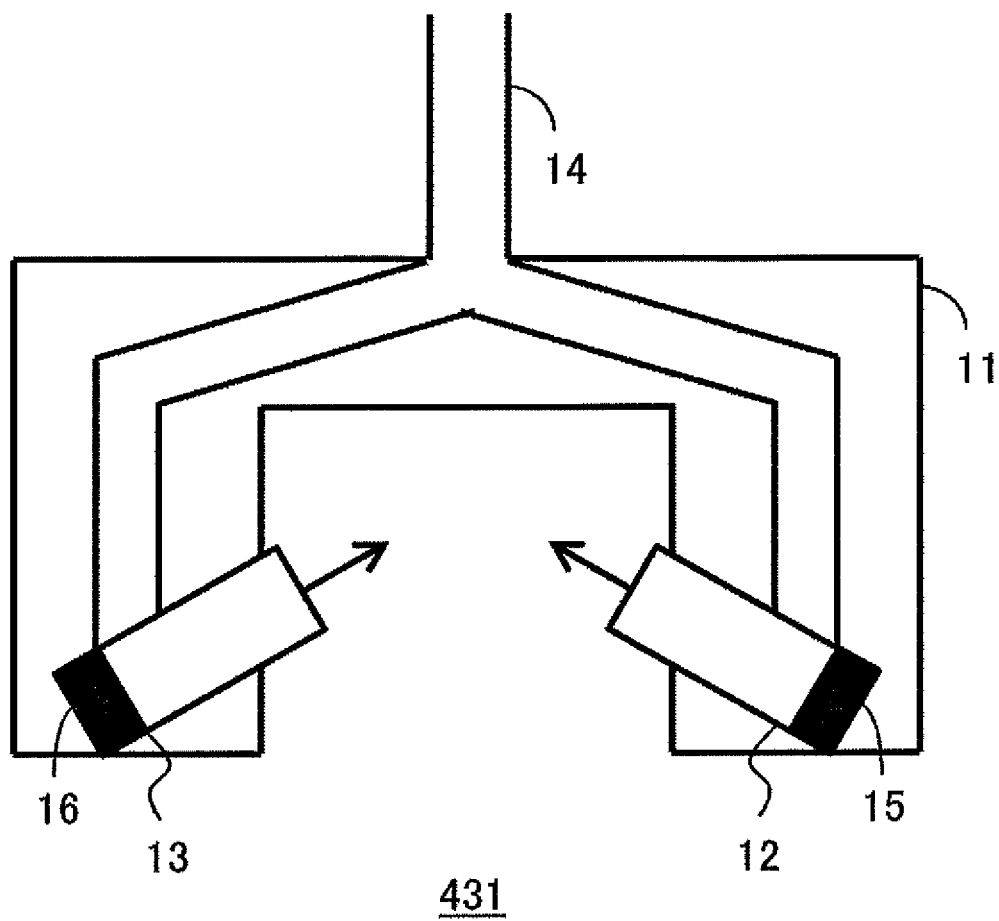
[Fig. 5 C]
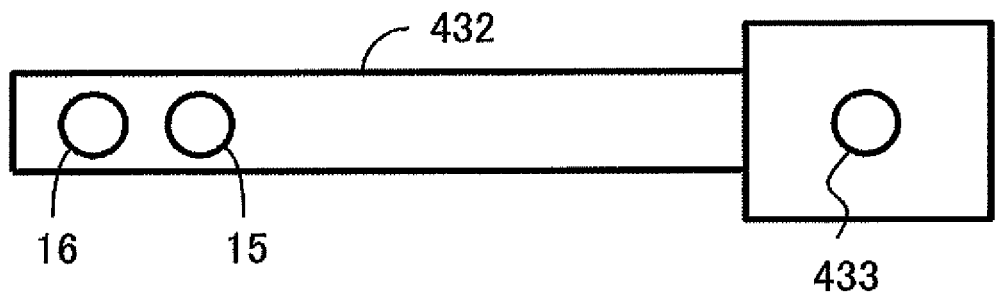

[Fig. 5 D]
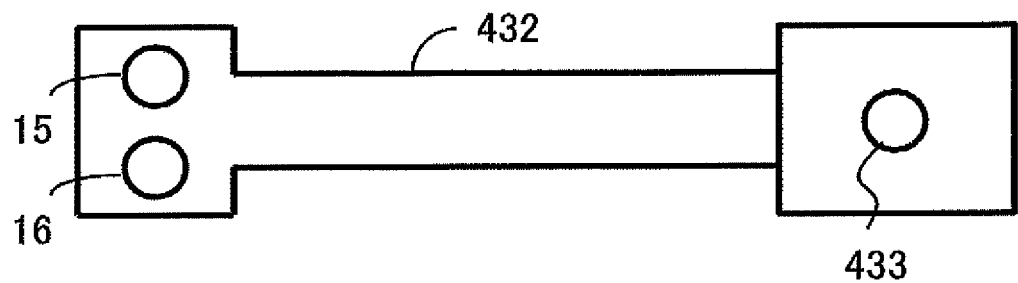
[Fig. 5 E]
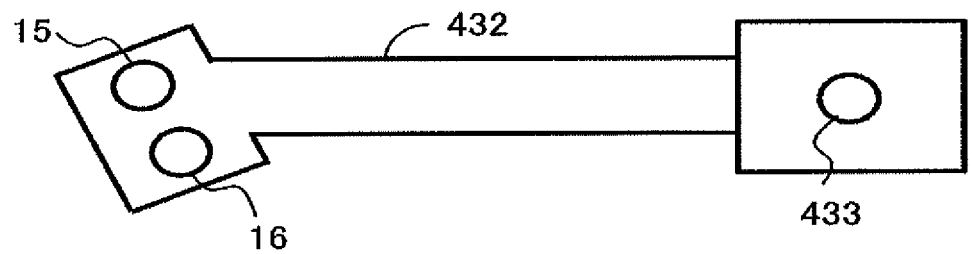
[Fig. 6 A]
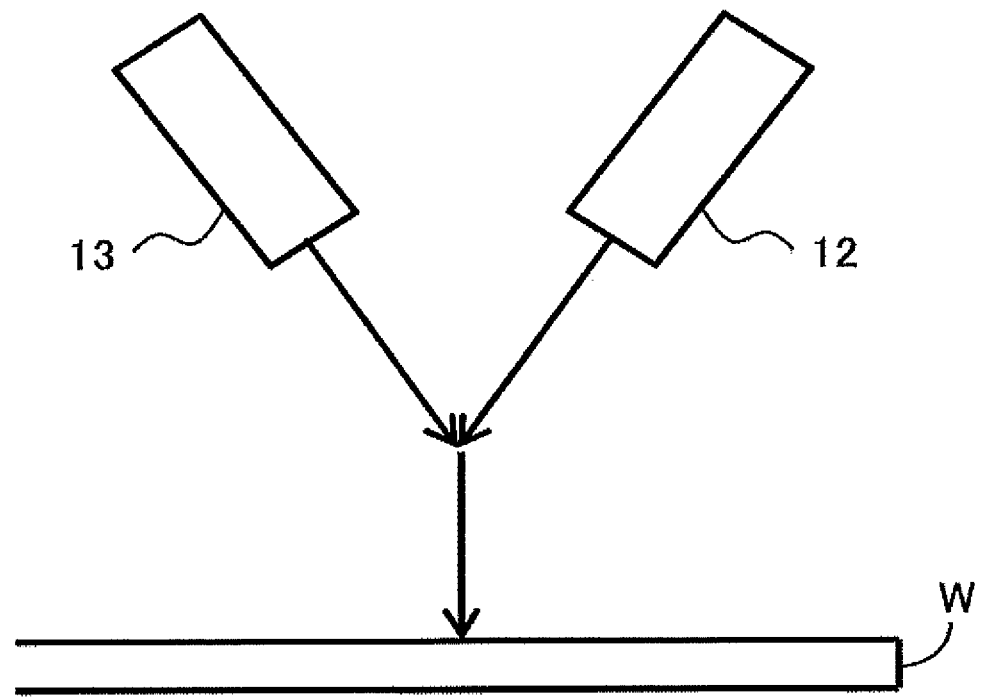

[Fig. 6 B]
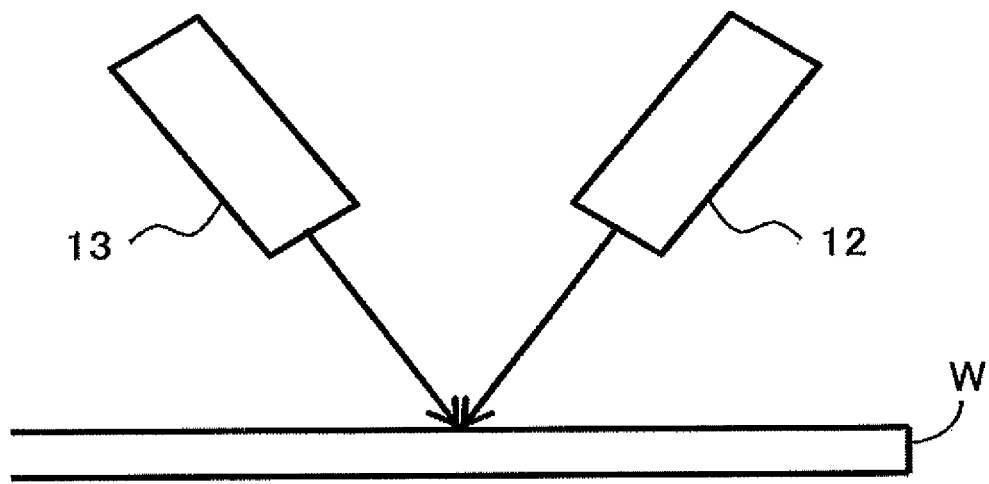
[Fig. 6 C]
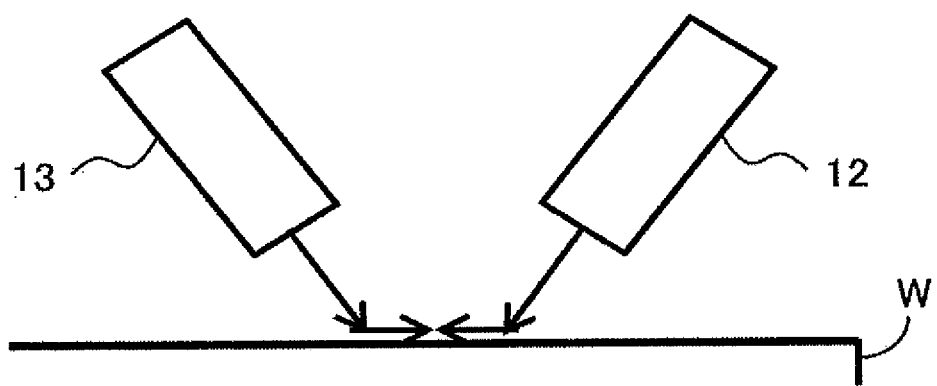

[Fig. 7]
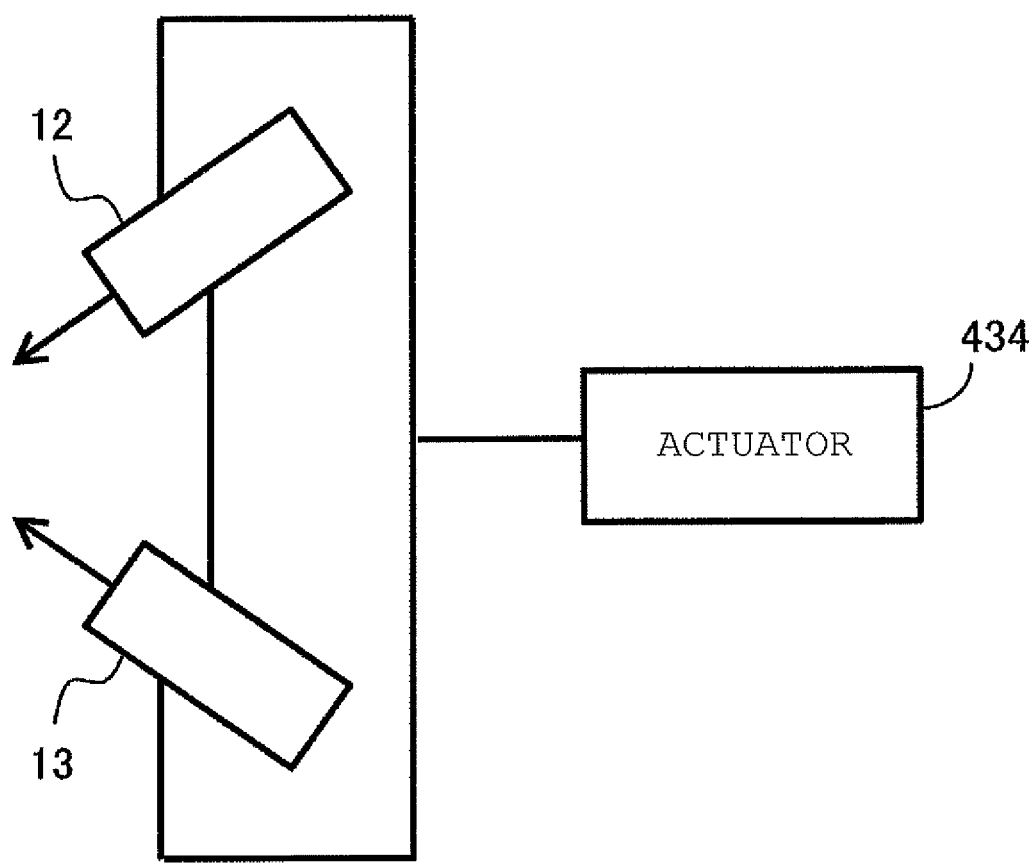

[Fig. 8]
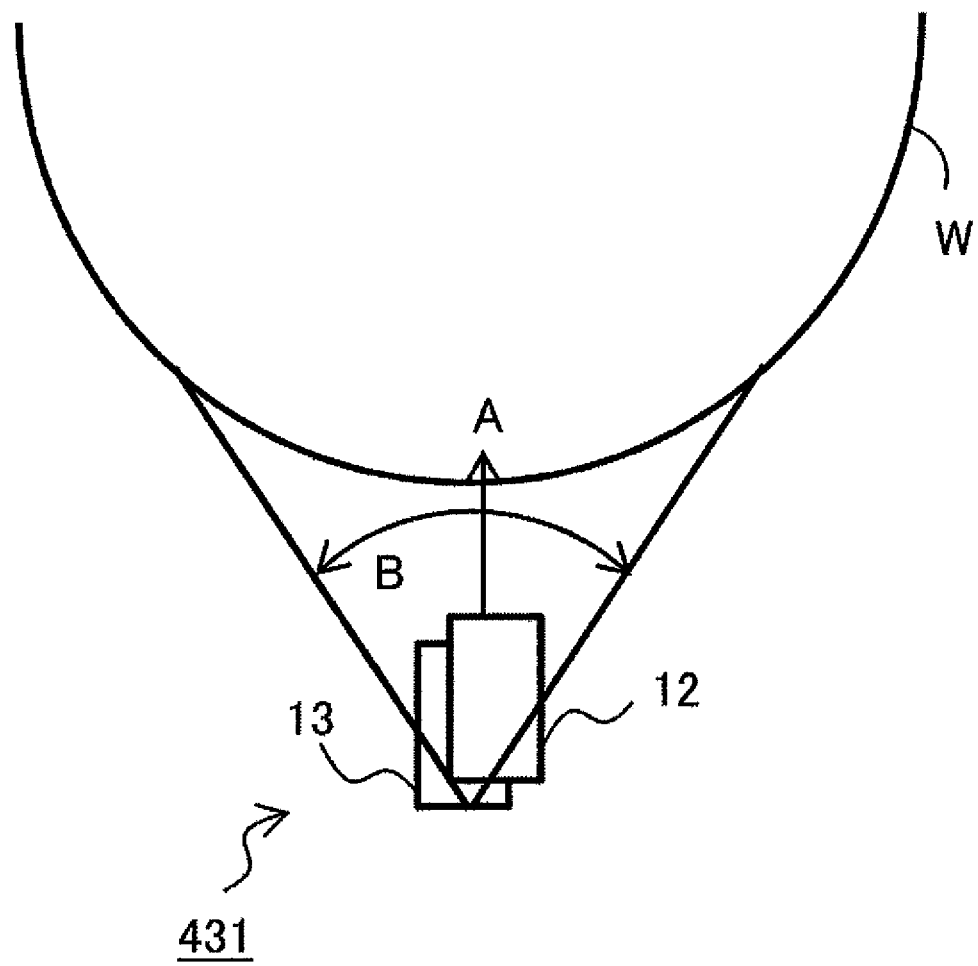

[Fig. 9 A]
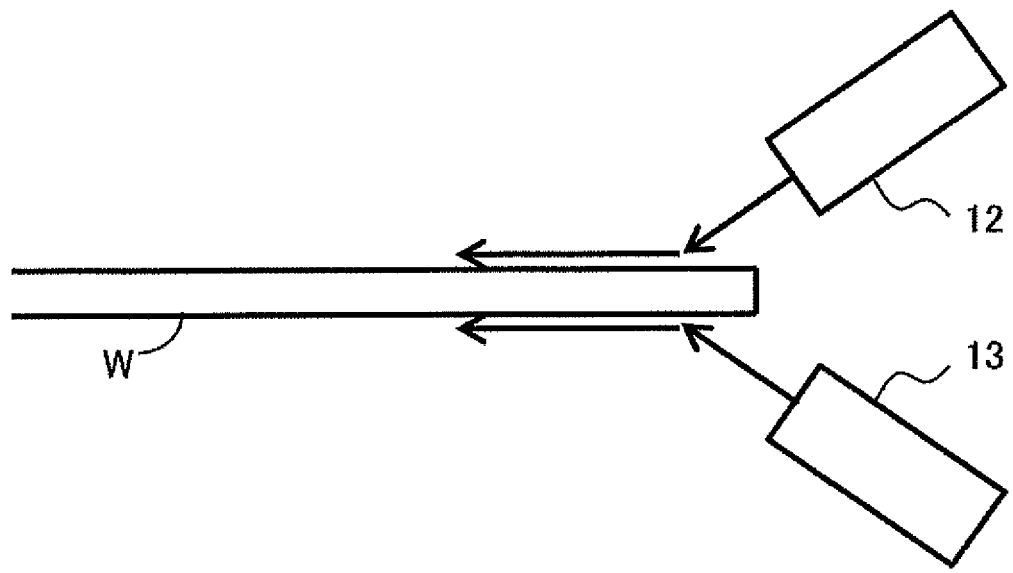
[Fig. 9 B]
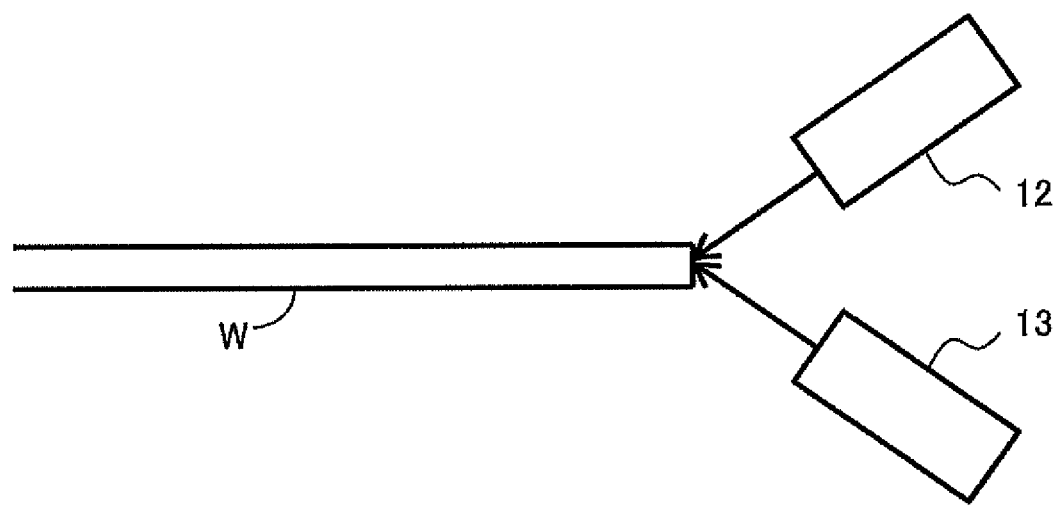

[Fig. 9C]
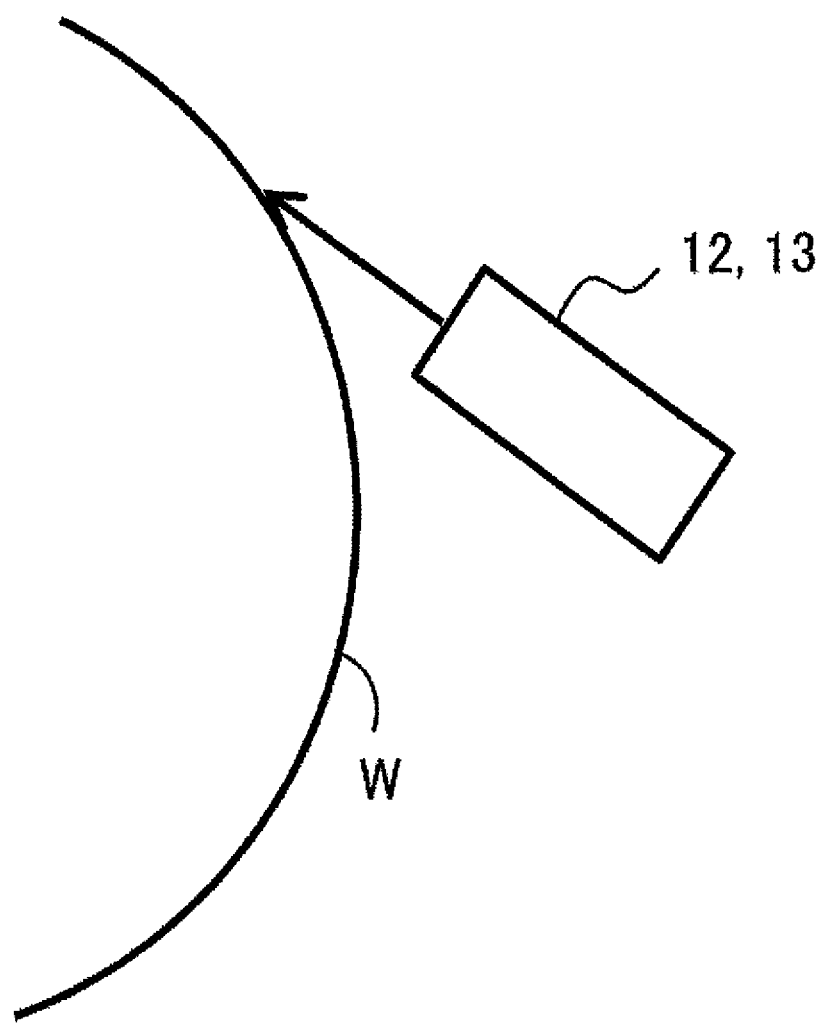

[Fig. 9 D]
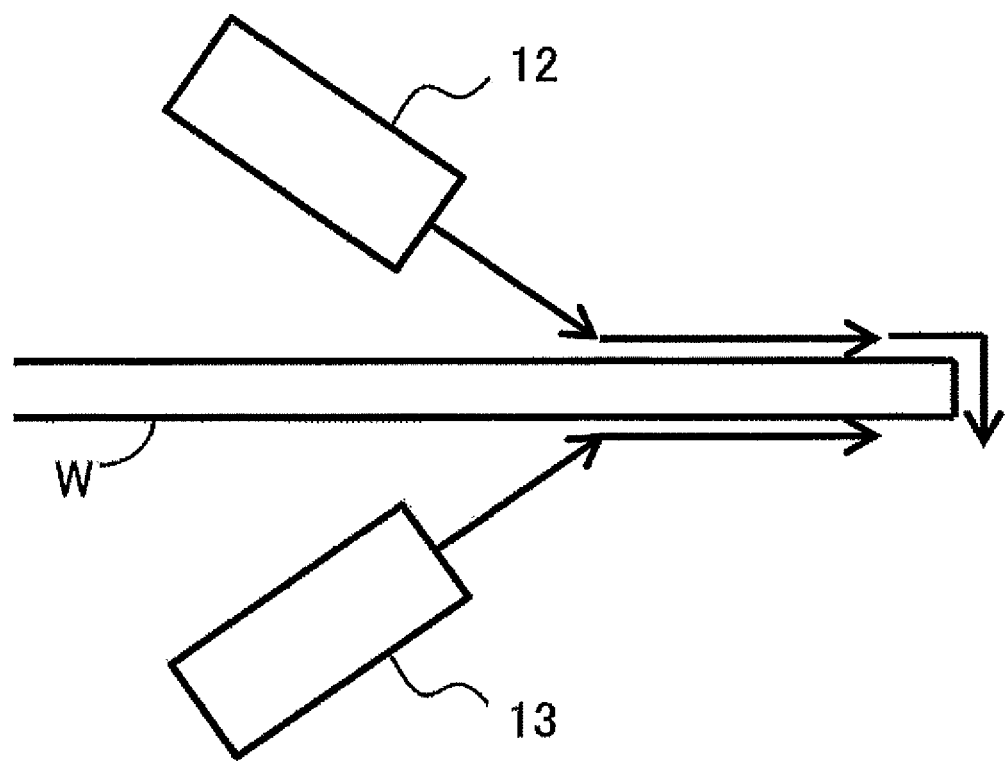

[Fig. 9 E]
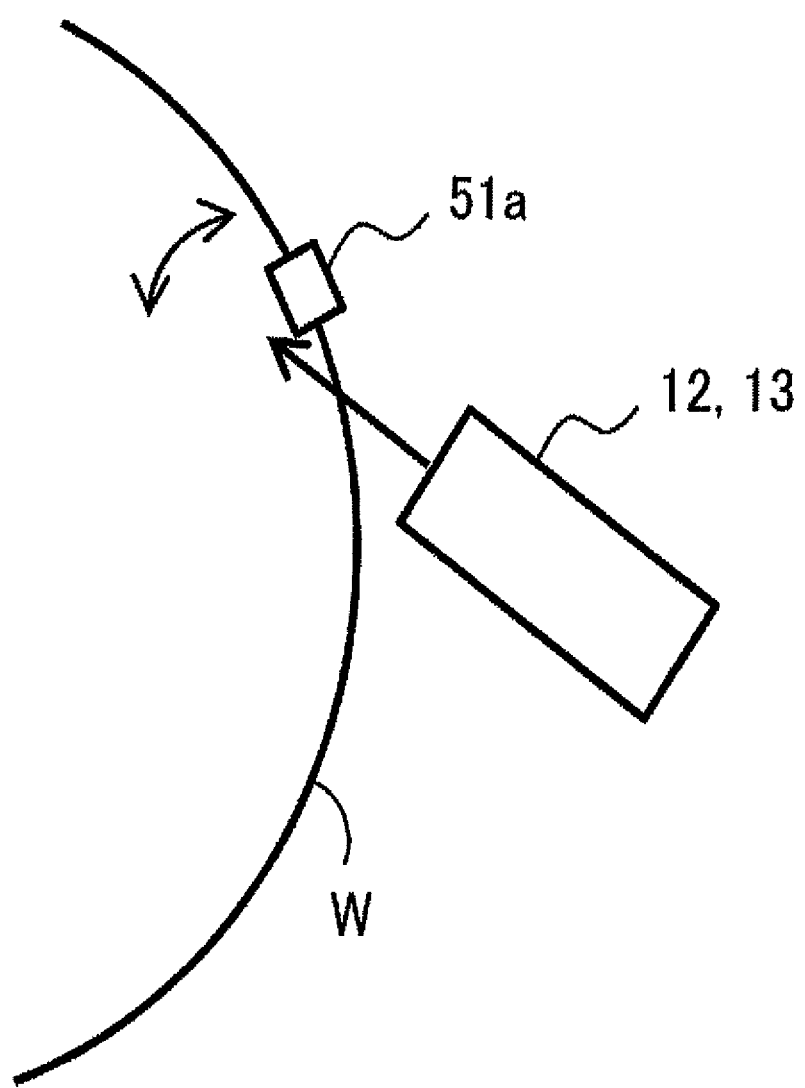

[Fig. 1 0]
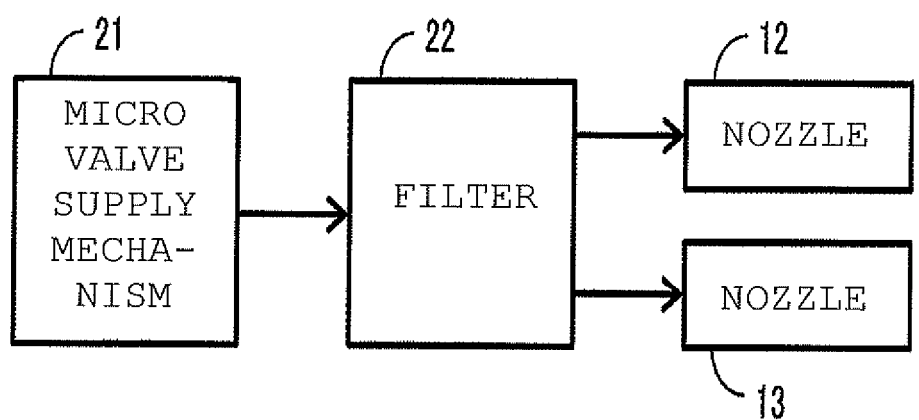

SUBSTRATE CLEANING DEVICE AND SUBSTRATE CLEANING METHOD

TECHNICAL FIELD

The present invention relates to a substrate cleaning device and a substrate cleaning method for cleaning a substrate using an ultrasonic cleaning solution.

BACKGROUND ART

A substrate cleaning device that cleans a substrate using an ultrasonic cleaning solution is known (Patent Literature 1).

CITATION LIST

Patent Literature

Patent Literature 1: JP 2017-162889 A

SUMMARY OF INVENTION

Technical Problem

An object of the present invention is to provide a substrate cleaning device and a substrate cleaning method having high detergency.

Solution to Problem

According to one embodiment of the present invention, provided is a substrate cleaning device comprising: a substrate rotating mechanism that rotates a substrate; and a first nozzle and a second nozzle that eject an ultrasonic cleaning solution toward a predetermined surface of the substrate that is rotated, wherein the first nozzle and the second nozzle are held in one casing.

An ultrasonic cleaning solution from the first nozzle and an ultrasonic cleaning solution from the second nozzle may reach the predetermined surface after being mixed with each other, or may be mixed with each other after reaching the predetermined surface.
wherein the first nozzle and the second nozzle are attached to a tip end of an arm that turns about a turning shaft and eject an ultrasonic cleaning solution on a first surface of the substrate.

It is preferable that the first nozzle ejects an ultrasonic cleaning solution on a first surface of the substrate that is rotated, and the second nozzle ejects an ultrasonic cleaning solution on a second surface opposite to the first surface of the substrate that is rotated.

It is preferable that the first nozzle and/or the second nozzle ejects an ultrasonic cleaning solution on an edge portion of the substrate that is rotated.

It is preferable that the first nozzle and/or the second nozzle that ejects an ultrasonic cleaning solution on the edge portion ejects the ultrasonic cleaning solution such that the ultrasonic cleaning solution lands on the edge portion of the substrate that is rotated without hitting a bevel of the substrate and then moves toward a center from the edge portion.

It is preferable that the first nozzle and/or the second nozzle that ejects an ultrasonic cleaning solution on the edge portion ejects the ultrasonic cleaning solution such that the ultrasonic cleaning solution lands on a center side of the edge portion of the substrate that is rotated and then moves toward the edge portion.

It is preferable that the first nozzle and/or the second nozzle ejects an ultrasonic cleaning solution on a bevel of the substrate that is rotated.

It is preferable that the first nozzle and/or the second nozzle that ejects an ultrasonic cleaning solution on the bevel ejects the ultrasonic cleaning solution in a tangential direction of the substrate that is rotated.

It is preferable that the first nozzle and the second nozzle eject an ultrasonic cleaning solution to an edge portion of the substrate while swinging in a vicinity of the substrate rotating mechanism.

The substrate cleaning device may further comprise: a flow path that is connected to the casing and supplies a cleaning fluid to the first nozzle and the second nozzle; a transducer that applies ultrasonic waves to the cleaning fluid supplied from the flow path; and a microbubble supply mechanism that is connected to the flow path and introduces microbubbles into the cleaning fluid.

The substrate cleaning device may further comprise a filter that is installed between the microbubble supply mechanism and the first and second nozzles, and configured to remove microbubbles introduced by the microbubble supply mechanism.

According to another embodiment of the present invention, provided is a substrate cleaning method comprising ejecting an ultrasonic cleaning solution from a first nozzle and a second nozzle held in one casing toward a predetermined surface of a substrate while rotating the substrate.

It is preferable that an ultrasonic cleaning solution ejected from the first nozzle and an ultrasonic cleaning solution ejected from the second nozzle are different from each other in at least one of frequency, electric power, flow rate, temperature, and type of fluid of the ultrasonic cleaning solutions.

Advantageous Effects of Invention

The detergency is improved.

BRIEF DESCRIPTION OF DRAWINGS

FIG. 1 is a schematic top view of a substrate processing apparatus according to an embodiment.

FIG. 2 is a plan view showing a schematic configuration of a substrate cleaning device 4.

FIG. 3 is a side view showing a schematic configuration of the substrate cleaning device 4.

FIG. 4 is a perspective view showing a schematic configuration of another substrate cleaning device 4'.

FIG. 5A is a cross-sectional view of a head 431 of an ultrasonic cleaning solution supply device 43.

FIG. 5B is a cross-sectional view of the head 431 of the ultrasonic cleaning solution supply device 43.

FIG. 5C is a diagram showing an arrangement example of nozzles 12 and 13.

FIG. 5D is a diagram showing an arrangement example of the nozzles 12 and 13.

FIG. 5E is a diagram showing an arrangement example of the nozzles 12 and 13.

FIG. 6A is a diagram showing an example of a method of ejecting an ultrasonic cleaning solution on a front surface of a substrate W.

FIG. 6B is a diagram showing an example of the method of ejecting an ultrasonic cleaning solution on the front surface of the substrate W.

FIG. 6C is a diagram showing an example of the method of ejecting an ultrasonic cleaning solution on the front surface of the substrate W.

FIG. 7 is a diagram showing an arrangement of nozzles 12 and 13 of a second embodiment.

FIG. 8 is a diagram showing the positional relationship between a substrate W and a head 431 as viewed from above.

FIG. 9A is a diagram showing an example of a method of ejecting an ultrasonic cleaning solution on a front surface and a back surface of the substrate W.

FIG. 9B is a diagram showing another example of the method of ejecting an ultrasonic cleaning solution on the front surface and the back surface of the substrate W.

FIG. 9C is a diagram of FIG. 9B as viewed from above.

FIG. 9D is a diagram showing another example of the method of ejecting an ultrasonic cleaning solution on the front surface and the back surface of the substrate W.

FIG. 9E is a diagram showing another example of the method of ejecting an ultrasonic cleaning solution on the front surface and the back surface of the substrate W.

FIG. 10 is a block diagram showing a schematic configuration of an ultrasonic cleaning solution supply device 43'.

DESCRIPTION OF EMBODIMENTS

Hereinafter, embodiments according to the present invention will be specifically described with reference to the drawings.

First Embodiment

FIG. 1 is a schematic top view of a substrate processing apparatus according to an embodiment. This substrate processing apparatus is used for processing various substrates in a manufacturing process of a semiconductor wafer with a diameter of 300 mm or 450 mm, a flat panel, an image sensor such as a complementary metal oxide semiconductor (CMOS) and a charge coupled device (CCD), and a magnetic film for a magnetoresistive random access memory (MRAM). Additionally, the shape of the substrate is not limited to a circular shape, and may be a rectangular shape (square shape) or a polygonal shape. Note that in the present description, the "edge" of a substrate refers to a flat portion near the outer periphery of a substrate front surface, and more specifically, it can be considered as a flat portion within a predetermined distance from the edge of the substrate. Additionally, in the present description, the "bevel" of a substrate refers to a curved surface portion or a chamfered portion inclined from the substrate front surface outside the edge, and a side surface portion.

The substrate processing apparatus includes a substantially rectangular housing 1, a load port 2 on which a substrate cassette for stocking many substrates is placed, one or more (four in mode shown in FIG. 1) substrate polishing devices 3, one or more (two in mode shown in FIG. 1) substrate cleaning devices 4, a substrate drying device 5, transfer mechanisms 6a to 6d, and a controller 7.

The load port 2 is arranged adjacent to the housing 1. An open cassette, a standard mechanical interface (SMIF) pod, or a front opening unified pod (FOUP) can be mounted on the load port 2. An SMIF pod and an FOUP are sealed containers that can house a substrate cassette therein and cover it with a partition wall to maintain an environment independent of the external space. Examples of the substrate include a semiconductor wafer and the like.

The substrate polishing devices 3 that polish a substrate, the substrate cleaning devices 4 that clean the substrate after polishing, and the substrate drying device 5 that dries the substrate after cleaning are housed in the housing 1. The substrate polishing devices 3 are arranged along the longitudinal direction of the substrate processing apparatus, and the substrate cleaning devices 4 and the substrate drying device 5 are also arranged along the longitudinal direction of the substrate processing apparatus. Additionally, the substrate cleaning device 4 and the substrate drying device 5 may each be configured as a substantially rectangular casing (not shown), and be freely openable and closable by a shutter mechanism so that a substrate to be processed can be moved in and out from an opening/closing portion provided in a casing portion. Alternatively, as a modified example, the substrate cleaning device 4 and the substrate drying device 5 may be integrated, and substrate cleaning processing and substrate drying processing may be performed continuously in one unit.

In the present embodiment, the substrate cleaning device 4 performs contact cleaning using a pen-type cleaning tool and non-contact cleaning using ultrasonic cleaning water. Although details will be described later, contact cleaning using a pen-type cleaning tool means that in the presence of a cleaning fluid, a lower end contact surface of a vertically extending cylindrical pen-type cleaning tool is brought into contact with a substrate, and the cleaning tool is moved in one direction while being rotated to clean the front surface of the substrate by scrubbing.

As the substrate drying device 5, a spin drying unit can be used in which IPA vapor is ejected from a moving ejection nozzle toward a horizontally rotating substrate to dry the substrate, and the substrate is further rotated at high speed to dry the substrate by centrifugal force.

The transfer mechanism 6a is arranged in an area surrounded by the load port 2, the substrate polishing device 3 located on the load port 2 side, and the substrate drying device 5. Additionally, the transfer mechanism 6b is arranged in parallel with the substrate polishing devices 3, the substrate cleaning devices 4, and the substrate drying device 5. The transfer mechanism 6a receives a substrate before polishing from the load port 2 and transfers it to the transfer mechanism 6b, or receives a dried substrate taken out from the substrate drying device 5 from the transfer mechanism 6b.

The transfer mechanism 6c that transfers a substrate between the two substrate cleaning devices 4 is arranged between the substrate cleaning devices 4, and the transfer mechanism 6c that transfers a substrate between the substrate cleaning device 4 and the substrate drying device 5 is arranged between the substrate cleaning device 4 and the substrate drying device 5.

Moreover, the controller 7 that controls the movement of each device of the substrate processing apparatus is arranged inside the housing 1. While the present embodiment will be described using a mode in which the controller 7 is arranged inside the housing 1, the present invention is not limited to this, and the controller 7 may be arranged outside the housing 1.

FIGS. 2 and 3 are a plan view and a side view showing a schematic configuration of the substrate cleaning device 4. The substrate cleaning device 4 includes a substrate rotating mechanism 41, a pen cleaning mechanism 42, and an ultrasonic cleaning solution supply device 43, which are housed in a casing 44 having a shutter 44a. Additionally, each unit in the substrate cleaning device 4 is controlled by the controller 7 of FIG. 1.

The substrate rotating mechanism 41 has a chuck claw 411 and a rotary drive shaft 412.

The chuck claw 411 is a holding member provided so as to hold a substrate W by gripping an outer peripheral end (edge portion) of the substrate W to be cleaned. In the present embodiment, four chuck claws 411 are provided, and an interval is provided between adjacent chuck claws 411 so as not to hinder the movement of a robot hand (not shown) that transfers the substrate W. The chuck claws 411 are all connected to the rotary drive shaft 412 so that the surface of the substrate W can be held horizontally. In the present embodiment, the substrate W is held by the chuck claws 411 so that a front surface WA of the substrate W faces upward.

The rotary drive shaft 412 is configured to be rotatable about an axis extending perpendicular to the surface of the substrate W, and the rotation about the axis of the rotary drive shaft 412 allows the substrate W to rotate in a horizontal plane. The controller 7 controls the rotation direction and the rotation speed of the rotary drive shaft 412. The rotation speed may be constant or variable.

Additionally, in order to prevent the cleaning fluid or ultrasonic cleaning solution described later from scattering, a rotating cup that is outside the substrate rotating mechanism 41 (more specifically, outside chuck claw 411), covers the periphery of the substrate W, and rotates in synchronization with the rotary drive shaft 412 may be provided.

Additionally, the rotating cup may be configured such that a downward airflow supplied into the unit from an FFU above the cleaning unit (not shown) passes through a hole provided in the rotating cup and escapes downward. With this configuration, it is possible to more reliably prevent the cleaning fluid or ultrasonic cleaning solution from scattering.

The pen cleaning mechanism 42 includes a pen-type cleaning tool 421, an arm 422 that supports the pen-type cleaning tool 421, a moving mechanism 423 that moves the arm 422, a cleaning fluid nozzle 424, a rinse fluid nozzle 425, and a cleaning device 426.

The pen-type cleaning tool 421 is a cylindrical PVA (e.g., sponge) cleaning tool, for example, and is arranged above the substrate W held by the chuck claws 411, so that the axis of the pen-type cleaning tool 421 is perpendicular to the substrate W. The pen-type cleaning tool 421 has a lower surface that cleans the substrate W, and an upper surface that is supported by the arm 422.

The arm 422 is a flat bar-shaped member, and is typically arranged so that the longitudinal direction of the arm 422 is parallel to the substrate W. One end of the arm 422 supports the pen-type cleaning tool 421 rotatably about its axis, and the other end of the arm 422 is connected to the moving mechanism 423.

The moving mechanism 423 moves the arm 422 vertically, and also swings the arm 422 in a horizontal plane. The horizontal swing of the arm 422 by the moving mechanism 423 is such that the trajectory of the pen-type cleaning tool 421 draws an arc around the other end of the arm 422. As indicated by arrow A, the moving mechanism 423 can swing the pen-type cleaning tool 421 between the center of the substrate W and a retracted position outside the substrate W. The moving mechanism 423 is controlled by the controller 7.

The cleaning fluid nozzle 424 supplies a cleaning fluid such as a chemical solution or pure water when cleaning the substrate W with the pen-type cleaning tool 421. The rinse fluid nozzle 425 supplies a rinse fluid such as pure water to the substrate W. The cleaning fluid nozzle 424 and the rinse fluid nozzle 425 are preferably provided not only for the front surface WA of the substrate W but also for a back surface WB of the substrate W. The controller 7 controls the supply timing and supply amount of the cleaning fluid and the rinse fluid.

The cleaning device 426 is arranged outside the position where the substrate W is arranged, and the moving mechanism 423 can move the pen-type cleaning tool 421 onto the cleaning device 426. The cleaning device 426 cleans the pen-type cleaning tool 421.

In the pen cleaning mechanism 42 described above, the substrate W is physically cleaned in a contacting manner by supplying the cleaning fluid onto the substrate W from the cleaning fluid nozzle 424 and swinging the arm 422 with the lower surface of the pen-type cleaning tool 421 in contact with the front surface WA of the substrate W while the substrate W is rotated.

The ultrasonic cleaning solution supply device 43 is arranged on the opposite side of the pen cleaning mechanism 42 with the substrate W interposed therebetween, and cleans the substrate W in a non-contacting manner using a cleaning fluid to which ultrasonic waves are applied (hereinafter also referred to as ultrasonic cleaning solution).

The ultrasonic cleaning solution supply device 43 includes a head 431, an arm 432, an arm turning shaft 433, and the like. The arm turning shaft 433 extends in the vertical direction, and one end of the arm 432 is attached to the upper end of the arm turning shaft 433. The arm 432 extends in the horizontal direction, and the head 431 is fixed to the tip end of the arm 432. The arm 432 is turned by rotation of the arm turning shaft 433, and the head 431 supplies the ultrasonic cleaning solution to the substrate W while swinging from the center to outer periphery of the substrate W (arrow B). The ultrasonic cleaning solution supply device 43 will be described in more detail later.

FIG. 4 is a perspective view showing a schematic configuration of another substrate cleaning device 4'. The substrate cleaning device 4' includes a spindle 51, a pen cleaning mechanism 42, and an ultrasonic cleaning solution supply device 43. In this substrate cleaning device 4', the spindle 51 functions as a substrate rotating mechanism, which is different from the substrate cleaning device 4 shown in FIGS. 2 and 3.

The spindle 51 supports a peripheral edge portion of a substrate W with its front surface facing upward, and rotates the substrate W in a horizontal plane. More specifically, a peripheral edge portion of the substrate W is placed in a gripping groove formed on an outer peripheral surface of a buffer material 51a provided on an upper portion of the spindle 51 to push the substrate W inward, and the substrate W is rotated by rotating (spinning) the buffer material 51a. Here, the "buffer material" can be restated as a "gripping portion" for gripping the substrate. Additionally, the "spindle" can be restated as a "roller". Since other parts are common to the substrate cleaning device 4 shown in FIGS. 2 and 3, detailed description thereof will be omitted.

FIGS. 5A and 5B are cross-sectional views schematically showing the head 431 of the present embodiment. The head 431 has a casing 11, two nozzles 12 and 13 held by the casing 11, a flow path 14, and transducers 15 and 16. The cleaning fluid supplied from the outside through the flow path 14 branches in the casing 11 and is supplied to each of the nozzles 12 and 13. Then, ultrasonic waves are applied to the cleaning fluid by the transducers 15 and 16 arranged inside the nozzles 12 and 13, respectively, to create an ultrasonic cleaning solution, which is ejected from the tip ends of the nozzles 12 and 13. The nozzles 12 and 13 are preferably held in the casing 11 so that the ejection direction can be adjusted arbitrarily.

Since the two nozzles 12 and 13 are held in the casing 11, by accurately determining the position and angle of the two nozzles, the ejection position and the ejection angle of the ultrasonic cleaning solution on the substrate W can be prevented from varying among products.

Note that while FIGS. 5A and 5B show an example in which one flow path 14 branches into the nozzles 12 and 13, a flow path for supplying the cleaning fluid to the nozzle 12 and a flow path for supplying the cleaning fluid to the nozzle 13 may be provided separately.

FIG. 5A is a configuration example in which the ultrasonic cleaning solution is ejected to the outside of the casing 11 from the nozzles 12 and 13. FIG. 5B is a configuration example in which the ultrasonic cleaning solution is ejected to the inside of a C-shaped casing 11 from the nozzles 12 and 13.

Additionally, the two nozzles 12 and 13 may be arranged in the same direction as the longitudinal direction of the arm 432 (FIG. 5C), may be arranged in a direction orthogonal to the longitudinal direction of the arm 432 (FIG. 5D), or may be arranged in a direction inclined at any angle with respect to the longitudinal direction of the arm 432 (FIG. 5E).

Here, the two nozzles 12 and 13 may eject the same ultrasonic cleaning solution, or may eject different ultrasonic cleaning solutions.

As a specific example of different ultrasonic cleaning solutions, the ultrasonic cleaning solutions may have different frequencies. As an example, the frequency of the ultrasonic cleaning solution from the nozzle 12 may be about 0.8 to 1 MHz, and the frequency of the ultrasonic cleaning solution from the nozzle 13 may be about 2 to 3 MHz. Alternatively, the former may be about 450 kHz and the latter about 1 MHz.

Generally, an ultrasonic cleaning solution having a higher frequency can remove smaller foreign substances. Hence, by ejecting ultrasonic cleaning solutions having different frequencies, foreign substances of different sizes can be removed.

As another example, the ultrasonic cleaning solutions may have different electric powers. As an example, the ultrasonic cleaning solution from the nozzle 12 may be 50 W and the ultrasonic cleaning solution from the nozzle 13 may be 30 W.

Generally, when ultrasonic waves are applied to a cleaning fluid, the ultrasonic waves act as a decompressing force at a certain moment and as a compressing force at another moment. At the moment when the decompressing force acts on the cleaning fluid, air bubbles are generated, whereby surrounding cleaning fluid molecules collide with each other to generate a shock wave and destroy contaminants. Accordingly, the larger the electric power for generating ultrasonic waves, the larger the vibration of liquid particles, whereby a larger acceleration causes a larger shock wave and smaller foreign substances can be removed. By ejecting ultrasonic cleaning solutions having different electric powers, foreign substances of different sizes can be removed.

As yet another example, the ultrasonic cleaning solutions may be ejected at different flow rates. As an example, the ultrasonic cleaning solution from the nozzle 12 may be ejected at 1.0 L/sec and the ultrasonic cleaning solution from the nozzle 13 may be ejected at 2.0 L/sec.

In general, the higher the flow rate of the cleaning fluid, the greater the impact force when the cleaning fluid is supplied to the substrate. Hence, it becomes easier to remove foreign substances that have adhered more strongly to the substrate. On the other hand, the lower the flow rate of the cleaning fluid, the smaller the impact force when the cleaning fluid is supplied to the substrate. This reduces the risk of pattern collapse. For this reason, by ejecting ultrasonic cleaning solutions at different flow rates, it is possible to more effectively remove foreign substances having different adhesion forces to the substrate while reducing the risk of pattern collapse of the substrate. Additionally, a valve mechanism which is provided in a pipe connected to each nozzle and whose opening can be adjusted may be used as a flow rate adjusting mechanism in this case.

As yet another example, the ultrasonic cleaning solutions may have different temperatures. As an example, the ultrasonic cleaning solution from the nozzle 12 may be at a low temperature and the ultrasonic cleaning solution from the nozzle 13 may be at a high temperature (60 to 80 degrees).

In general, the higher the temperature of the cleaning fluid, the weaker the strength of the ultrasonic waves. Hence, by ejecting ultrasonic cleaning solutions of different temperatures, it is possible to more effectively remove foreign substances having different adhesion forces to the substrate while curbing the impact force on the substrate. A known cooling device or a heating device may be provided as a temperature adjusting mechanism.

As yet another example, different types of fluids may be used. As an example, the nozzle 12 may eject a chemical solution to which ultrasonic waves are applied, and the nozzle 13 may eject pure water to which ultrasonic waves are applied.

Here, examples of the chemical solution include acidic cleaning fluids such as citric acid-based solutions, oxalic acid, and nitric acid, or alkaline cleaning fluids such as organic alkali, ammonia water, and tetramethyl ammonium hydroxide (TMAH).

Additionally, various methods of ejecting the ultrasonic cleaning solution from the two nozzles 12 and 13 are conceivable. Note that in the following drawings, of the ultrasonic cleaning solution supply device 43, the casing 11, the flow path 14, and the transducers 15 and 16 are omitted, and only the nozzles 12 and 13 are shown.

As shown in FIG. 6A, the ultrasonic cleaning solutions from the two nozzles 12 and 13 may reach the front surface of the substrate W after being mixed with each other. More specifically, the ultrasonic cleaning solutions (at least part of them) ejected from the two nozzles 12 and 13 may be merged and mixed above the substrate W, and then dropped onto the substrate W.

As shown in FIG. 6B, the ultrasonic cleaning solutions from the two nozzles 12 and 13 may be merged and mixed on the substrate W.

As shown in FIG. 6C, the ultrasonic cleaning solutions from the two nozzles 12 and 13 may be mixed with each other after reaching the front surface of the substrate W. More specifically, the ultrasonic cleaning solutions ejected from the two nozzles 12 and 13 may land on two different separate points (areas) on the substrate W, and then flow toward each other to eventually merge and mix.

In this way, in the first embodiment, different ultrasonic cleaning solutions may be ejected on the front surface of the substrate W from the two nozzles 12 and 13. With this configuration, various foreign substances can be removed and the detergency is improved.

Note that the mode of the substrate cleaning device 4 is not limited to that shown in FIG. 2 and other drawings. For example, cleaning may be performed with a roll-type cleaning tool instead of the pen-type cleaning tool 421. Alternatively, a configuration may be adopted in which only an ultrasonic cleaning solution is used without using a cleaning tool. Moreover, instead of rotating the substrate W by the chuck claw 411 and the spindle 51, the substrate W may be supported on a stage from below and the stage may be rotated. Additionally, the number of nozzles is not limited to two, and instead of holding the multiple nozzles in the casing 11, the nozzles may be independent from one another.

Second Embodiment

In the above-described first embodiment, the ultrasonic cleaning solution is ejected on the front surface of the substrate W from the two nozzles 12 and 13. In a second embodiment described below, an ultrasonic cleaning solution is ejected on the front surface and the back surface of a substrate W from two nozzles 12 and 13. Hereinafter, differences from the first embodiment will mainly be described.

In the present embodiment, as shown in FIGS. 7 and 8, the two nozzles 12 and 13 in a head 431 are arranged in the vertical direction. Then, the nozzle 12 ejects the ultrasonic cleaning solution downward, and the nozzle 13 ejects the ultrasonic cleaning solution upward. Then, by arranging the substrate W between the nozzle 12 and the nozzle 13, in other words, by arranging the head 431 on the side of the substrate W by a mounting component (not shown), the ultrasonic cleaning solution is ejected on the front surface and the back surface of the substrate W from the nozzles 12 and 13, respectively. Note that while FIG. 8 shows the nozzles 12 and 13 with a slight offset, this is to facilitate understanding of the invention, and in the present embodiment, the nozzles 12 and 13 are aligned in the vertical direction.

Additionally, it is preferable that an actuator 434 is connected to the head 431 so that the head 431 can move toward and away from the side of the substrate W, as indicated by arrow A in FIG. 8. As a result, the ultrasonic cleaning solution can be ejected to any position from the center to edge portion of the substrate W. Additionally, it is preferable that the head 431 be retractable from the side of the substrate W, so that placement of the substrate W when holding the substrate by chuck claws 411 of a substrate rotating mechanism 41 is not hindered. Additionally, as indicated by arrow B, the head 431 is preferably rotatable in a horizontal plane. As a result, the ejection angle of the ultrasonic cleaning solution on the substrate W viewed from above can be adjusted arbitrarily, or the ultrasonic cleaning solution can be ejected on the substrate W in a swinging motion. Moreover, the chuck claw 411 of the substrate rotating mechanism 41 may be cleaned with the ultrasonic cleaning solution.

The ultrasonic cleaning solution may be ejected from the two nozzles 12 and 13 in various ways.

As shown in FIG. 9A, the nozzles 12 and 13 may eject the ultrasonic cleaning solution on edge portions of the front surface and the back surface of the substrate W, respectively. More specifically, the nozzle 12 ejects the ultrasonic cleaning solution in such a direction that the ultrasonic cleaning solution lands on the edge portion of the front surface of the substrate W, and then the ultrasonic cleaning solution moves toward the center from the fluid landing point on the front surface of the substrate W. On the other hand, the nozzle 13 ejects the ultrasonic cleaning solution in such a direction that the ultrasonic cleaning solution lands on the edge portion of the back surface of the substrate W and moves toward the center from the edge portion on the back surface of the substrate W. As a result, the substrate W can be cleaned from the edge portion to the center thereof.

Note that in this case, it is preferable to prevent the ultrasonic cleaning solution from hitting the bevel of the substrate W. This is to prevent foreign substances such as particles washed from the substrate W from adhering to and contaminating the front surface and the back surface of the substrate W including the edge portions.

As shown in FIG. 9B, the nozzles 12 and 13 may eject the ultrasonic cleaning solution on the bevel of the substrate W. Here, it is preferable to eject the ultrasonic cleaning solution in the tangential direction of the substrate W from the nozzles 12 and 13 (FIG. 9C) to prevent foreign substances washed from the bevel from reaching the front surface and the back surface of the substrate W together with the ultrasonic cleaning solution as much as possible. As a result, it is possible to curb contamination of the front surface and the back surface of the substrate W by the ultrasonic cleaning solution contaminated from cleaning the bevel. Note that if the contamination of the bevel is not such a big issue (if contamination is equal to or less than degree of contamination on the front surface and the back surface), the ultrasonic cleaning solution may be ejected in the radial direction of the substrate W from the nozzles 12 and 13, so that at least a part of the ultrasonic cleaning solution that hits the bevel moves toward the center of the substrate W.

Here, when cleaning both the edge portion and the bevel of the substrate W, it is preferable to first clean the bevel (FIG. 9B) and then the edge portion (FIG. 9A) using the actuator 434. This is because although the ultrasonic cleaning solution contaminated after cleaning the bevel sometimes scatters on the front surface of the substrate W, since the edge portion is cleaned after cleaning the bevel, it is possible to reduce the amount of contaminated ultrasonic cleaning solution remaining on the front surface of the substrate W.

Note that as in the example shown in FIG. 6A, the ultrasonic cleaning solutions from the two nozzles 12 and 13 may hit the bevel of the substrate W after being mixed with each other, or as in the example shown in FIG. 6B, the ultrasonic cleaning solutions from the two nozzles 12 and 13 may be merged at the bevel of the substrate W.

Note that the position where the ultrasonic cleaning solution hits the substrate W can be changed by driving the actuator 434 connected to the head 431 to move the head 431 toward and away from the side of the substrate W. For example, the substrate can be cleaned thoroughly by changing the liquid landing position on the front surface and the back surface of the substrate W while supplying the ultrasonic cleaning solution. Additionally, with one head 431, first, the ultrasonic cleaning solution may be supplied to the bevel of the substrate W to clean the bevel portion, and then the ultrasonic cleaning solution may be supplied to the front surface and the back surface of the substrate W to clean the front surface and the back surface.

As shown in FIG. 9D, the nozzle 12 may eject the ultrasonic cleaning solution in such a direction that the ultrasonic cleaning solution lands on the center side of the edge portion of the front surface of the substrate W and moves toward the edge portion from the fluid landing point on the front surface of the substrate W. Similarly, the nozzle 13 may eject the ultrasonic cleaning solution in such a direction that the ultrasonic cleaning solution lands on the center side of the edge portion of the back surface of the substrate W and moves toward the edge portion from the fluid landing point on the back surface of the substrate W.

The ultrasonic cleaning solution that reaches the edge portion on the front surface of the substrate W drops along the bevel of the substrate W.

Note that the ultrasonic cleaning solution may be ejected on the front surface of the substrate W as shown in FIG. 9D and then the bevel may be cleaned (FIG. 9B), the parts may be cleaned in the reverse order, or both methods may be repeated alternately.

Since the ultrasonic cleaning solution that lands on the front surface of the substrate W flows toward the edge of the substrate W, drainability of the ultrasonic cleaning solution is improved. Note that the nozzle 12 and the nozzle 13 may be nozzles independent of each other, and by using the head 431 having a C-shaped casing 11 as shown in FIG. 5B, the ultrasonic cleaning solution may be ejected toward the edge of the substrate so as to sandwich the edge of the substrate W with the casing 11.

As a result, it is possible to clean not only the outside (including edge portion) of the fluid landing point on the front surface and the back surface, but also the bevel of the substrate W. When the bevel is heavily contaminated, such a cleaning method in which the bevel is cleaned last is effective. Additionally, in the substrate cleaning device 4' that rotates the substrate W with the buffer material 51a shown in FIG. 4, the buffer material 51a in contact with the contaminated bevel is also contaminated. According to the ejection method shown in FIG. 9D, the ultrasonic cleaning solution reaches the buffer material 51a, too, so that the buffer material 51a itself can be cleaned as well.

The ultrasonic cleaning solution does not have to be ejected toward the center of the substrate in plan view. Moreover, as shown in FIG. 9E, the ultrasonic cleaning solution may be ejected while swinging the nozzles 12 and 13 above and below the edge portion of the substrate W and the vicinity of the buffer material 51a. Such swinging is achieved by a support turning mechanism of the nozzles 12 and 13 (not shown). For example, the actuator 434 may swing the nozzles 12 and 13. With this configuration, too, the ultrasonic cleaning solution reaches the buffer material 51a, so that the buffer material 51a itself can be cleaned.

As described above, according to the second embodiment, the front surface and the back surface of the substrate W can be cleaned at the same time, and the detergency is improved. In particular, it is possible to clean the edge portions on both sides and the bevel of the substrate W. Additionally, in the case of the substrate cleaning device 4' (FIG. 4) that rotates the substrate W with the buffer material 51a or a substrate cleaning device that rotates the substrate W by supporting its lower surface, the edge portion and bevel over the entire circumference of the substrate W can be cleaned. Even in the substrate cleaning device 4 (FIGS. 2 and 3) that rotates the substrate W with the chuck claw 411, the edge portion and bevel except for the portion held by the chuck claw 411 of the substrate W can be cleaned.

Note that the nozzles 12 and 13 may eject the ultrasonic cleaning solution toward different positions on the substrate W. For example, the nozzle 12 may eject the ultrasonic cleaning solution to the vicinity of the center of the front surface of the substrate W, and the nozzle 12 may eject the ultrasonic cleaning solution on the edge portion of the back surface of the substrate W. Additionally, the first embodiment and the second embodiment may be combined as appropriate.

Additionally, in order to prevent foreign substances washed from the edge portion or bevel portion of the substrate W by the ultrasonic cleaning solution supplied from the head 431 from reattaching to the front surface or the back surface of the substrate W, it is preferable to perform cleaning using the head 431 while cleaning the front surface and the back surface of the substrate W with other cleaning means. Examples of other cleaning means include scrub cleaning with a roll sponge or a pencil-type sponge, two-fluid cleaning, or cleaning with another ultrasonic cleaning solution supply nozzle.

Third Embodiment

A third embodiment described below introduces microbubbles into an ultrasonic cleaning solution, and can be combined with the first embodiment and/or the second embodiment.

FIG. 10 is a block diagram showing a schematic configuration of an ultrasonic cleaning solution supply device 43'. Note that a casing 11, a flow path 14, and transducers 15 and 16 shown in FIG. 5A and the like are omitted.

The ultrasonic cleaning solution supply device 43' includes a microbubble supply mechanism 21. The microbubble supply mechanism 21 is connected to the flow path 14 and introduces microbubbles into the cleaning fluid supplied to nozzles 12 and 13 through the flow path 14. The gas introduced as microbubbles is hydrogen, ozone, carbon dioxide, and the like, and functional water is generated by dissolving such gas. Additionally, the microbubble supply mechanism 21 may control the concentration of the dissolved gas. The concentration of dissolved gas is high around the micro valve. However, the micro valve itself weakens the detergent energy of ultrasonic waves, and may reduce the detergency.

Hence, it is preferable that the ultrasonic cleaning solution supply device 43' includes a filter 22. The filter 22 removes microbubbles. Note that the mesh size of the filter 22 is preferably 100 nm or less or 10 nm or less, for example.

Such an ultrasonic cleaning solution supply device 43' is provided in a substrate cleaning device. Then, the generated ultrasonic cleaning solution containing gas is supplied to the nozzles 12 and 13 and ejected on a substrate W.

As described above, in the third embodiment, gas is dissolved in the ultrasonic cleaning solution, so that the detergency is further improved. In particular, since ultrasonic cleaning utilizing cavitation is physical cleaning by applying ultrasonic waves to a liquid containing dissolved gas, the detergency of the ultrasonic cleaning solution in which a high concentration of gas is dissolved is extremely high.

The above embodiments have been described for the purpose of enabling a person having general knowledge in the art to which the present invention pertains to implement the present invention. Various modifications of the above embodiments can be naturally made by those skilled in the art, and the technical idea of the present invention can be applied to other embodiments. Hence, the present invention is not limited to the described embodiments, but should be the broadest scope according to the technical idea defined by the claims.

REFERENCE SIGNS LIST 4, 4' Substrate cleaning device
41 Substrate rotating mechanism
42 Pen cleaning mechanism
43 Ultrasonic cleaning solution supply device
431 Head
432 Arm
433 Arm turning shaft 51 Spindle
11 Casing
12, 13 Nozzle
14 Flow path
15, 16 Transducer
21 Microbubble supply mechanism
22 Filter

The invention claimed is:

1. A substrate cleaning device comprising:
a substrate rotating mechanism that rotates a substrate; and
a first nozzle and a second nozzle that eject an ultrasonic cleaning solution toward a predetermined surface of the substrate that is rotated, wherein
the first nozzle and the second nozzle are held in one casing, and
wherein the one casing is supported at a side of the substrate such that the first nozzle and/or the second nozzle ejects an ultrasonic cleaning solution on a bevel of the substrate that is rotated in a tangential direction of the substrate;
wherein the one casing is arranged at the side of the substrate such that
an ejection angle of the ultrasonic cleaning solution on the substrate from the first nozzle and the second nozzle is adjustable,
a first distance between the substrate and the first nozzle, and a second distance between the substrate and the second nozzle are adjustable.

2. The substrate cleaning device according to claim 1, wherein an ultrasonic cleaning solution from the first nozzle and an ultrasonic cleaning solution from the second nozzle
reach the predetermined surface after being mixed with each other, or
are mixed with each other after reaching the predetermined surface.

3. The substrate cleaning device according to claim 1, wherein the first nozzle and the second nozzle are attached to a tip end of an arm that turns about a turning shaft and eject an ultrasonic cleaning solution on a first surface of the substrate.

4. The substrate cleaning device according to claim 1, wherein
the first nozzle ejects an ultrasonic cleaning solution on a first surface of the substrate that is rotated, and
the second nozzle ejects an ultrasonic cleaning solution on a second surface opposite to the first surface of the substrate that is rotated.

5. The substrate cleaning device according to claim 1, wherein the first nozzle and/or the second nozzle ejects an ultrasonic cleaning solution on an edge portion of the substrate that is rotated.

6. The substrate cleaning device according to claim 5, wherein the first nozzle and/or the second nozzle that ejects an ultrasonic cleaning solution on the edge portion ejects the ultrasonic cleaning solution such that the ultrasonic cleaning solution lands on the edge portion of the substrate that is rotated without hitting a bevel of the substrate and then moves toward a center from the edge portion.

7. The substrate cleaning device according to claim 5, wherein the first nozzle and/or the second nozzle that ejects an ultrasonic cleaning solution on the edge portion ejects the ultrasonic cleaning solution such that the ultrasonic cleaning solution lands on a center side of the edge portion of the substrate that is rotated and then moves toward the edge portion.

8. The substrate cleaning device according to claim 1, wherein the first nozzle and the second nozzle eject an ultrasonic cleaning solution to an edge portion of the substrate while swinging in a vicinity of the substrate rotating mechanism.

* * * * *